(12) United States Patent
Chen et al.

(10) Patent No.: US 7,397,694 B2
(45) Date of Patent: Jul. 8, 2008

(54) MAGNETIC MEMORY ARRAYS

(75) Inventors: Chi-Ming Chen, Hsinchu (TW); Chien-Chung Hung, Taipei (TW); Young-Shying Chen, Hsinchu County (TW); Lien-Chang Wang, Taipei County (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 0 days.

(21) Appl. No.: 11/339,510

(22) Filed: Jan. 26, 2006

(65) Prior Publication Data

US 2007/0030723 A1 Feb. 8, 2007

(30) Foreign Application Priority Data

Aug. 4, 2005 (TW) .............................. 94126525 A (51) Int. Cl.
*G11C 11/00* (2006.01)
*G11C 7/02* (2006.01)

(52) U.S. Cl. ................. 365/158; 257/422; 365/214; 365/210.1; 365/209; 365/210.13

(58) Field of Classification Search ................. None
See application file for complete search history.

(56) References Cited

U.S. PATENT DOCUMENTS

| 5,982,658 | A * | 11/1999 | Berg et al. ............. 365/158 |
| 6,351,409 | B1 * | 2/2002 | Rizzo et al. ............ 365/158 |
| 6,740,947 | B1 * | 5/2004 | Bhattacharyya et al. ..... 257/421 |
| 6,803,274 | B2 * | 10/2004 | Sharma et al. ............ 438/257 |
| 2006/0023494 | A1 * | 2/2006 | Jeong et al. ............ 365/158 |
| 2007/0165451 | A1 * | 7/2007 | Leung ................... 365/158 |

* cited by examiner

*Primary Examiner*—Huan Hoang
*Assistant Examiner*—Michael J Weinberg
(74) *Attorney, Agent, or Firm*—Birch, Stewart, Kolasch & Birch, LLP (57) ABSTRACT

A magnetic memory array. A first bit line provides a first writing magnetic field to a magnetic memory cell. A second bit line provides a second writing magnetic field to a reference magnetic memory cell. A word line provides a third writing magnetic field to the magnetic memory cell and a fourth writing magnetic field to the reference magnetic memory cell. The third writing magnetic field exceeds the fourth writing magnetic field.

10 Claims, 7 Drawing Sheets

FIG. 11

MAGNETIC MEMORY ARRAYS

BACKGROUND OF THE INVENTION

1. Field of the Invention

The disclosure relates in general to a memory circuit. In particular, the disclosure relates to magnetic random access memory (MRAM) circuits.

2. Discussion of the Related Art

Magnetic Random Access Memory (MRAM) is a non-volatile memory used in long term data storage. The magnetic memory cell of MRAMs stores information by its magnetoresistance. When data is to be written to a magnetic memory cell, the magnetic memory cell is selected by providing magnetic fields respectively produced by a selected word line and bit line, and combined magnetic fields change the magnetic vector of the magnetic memory cell to change the resistance of the selected magnetic memory cell. When data is to be read from the selected magnetic memory cell, a sensing current passes through the selected magnetic memory cell, and the stored data is obtained according to the voltage difference across the selected magnetic memory cell.

Figure 1:
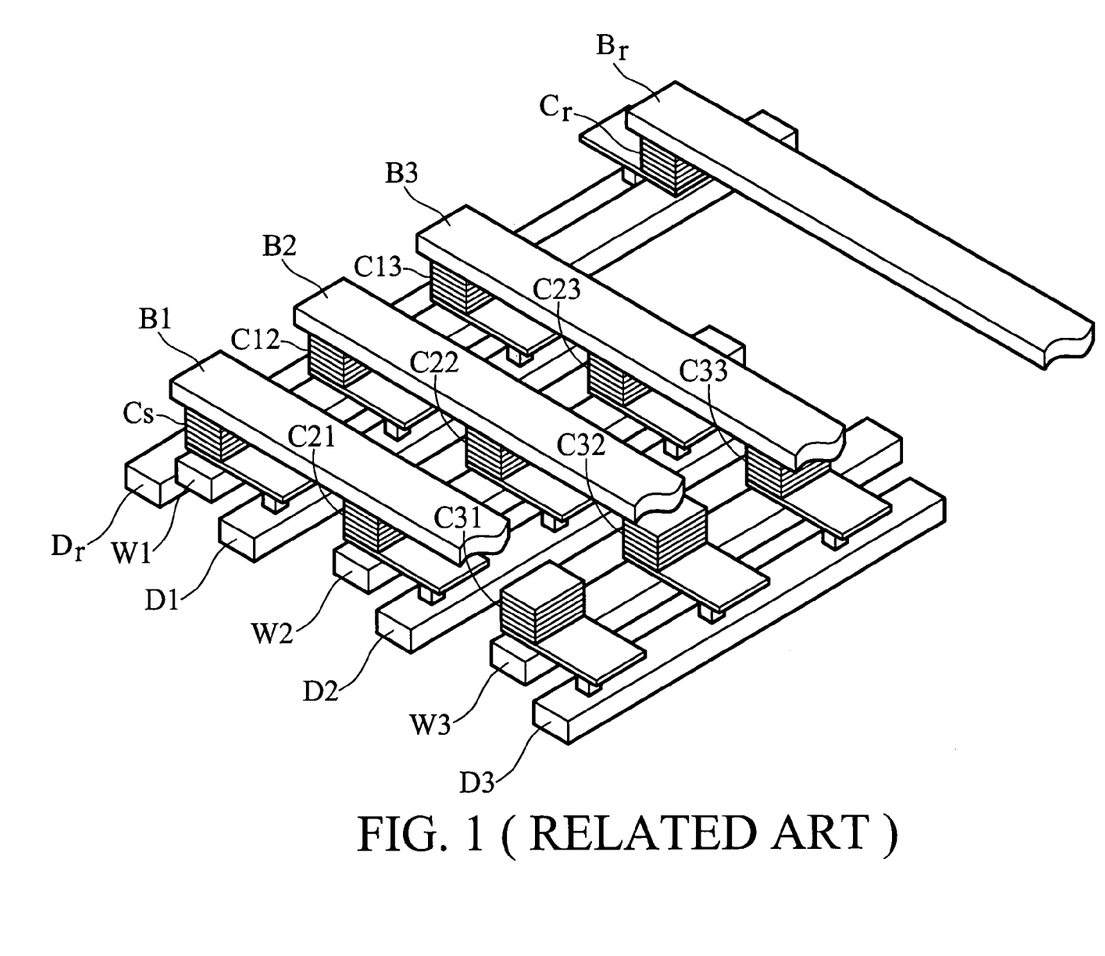
FIG. 1 is a schematic diagram of a conventional MRAM array.

FIG. 1 is a schematic diagram of a conventional MRAM array. The conventional MRAM array comprises bit lines B1~B3 and word lines W1~W3. The magnetic memory cell located at the intersection of one bit line and word line comprises a soft magnetic layer (free ferromagnetic layer), a tunnel barrier layer, a hard magnetic layer (pinned ferromagnetic layer) and a non-magnetic conductor. The relative magnetic orientations of the free ferromagnetic layer and the pinned ferromagnetic layer represent logic values of "0" and "1", for example.

The magnetic memory cell is written to by the magnetic field generated by the selected word line and bit line. Thus, only the magnetic dipole moment of the selected magnetic memory cell is switched. For example, the magnetic fields generated by bit line B1 and word line W1 switch only the magnetic dipole moment of magnetic memory cell Cs, without changing the state of non-selected magnetic memory cells C12, C13, C21, and C31.

Figure 2:
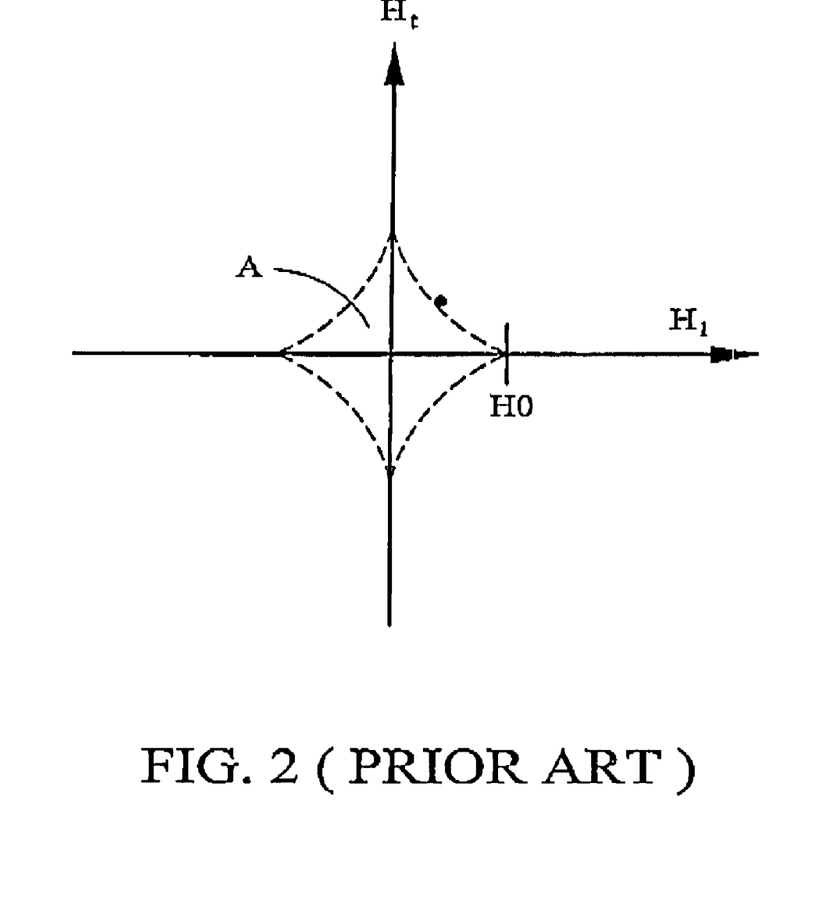
FIG. 2 shows a relationship between switching state of the magnetic memory cell and magnetic fields provided by the word line and bit line.

FIG. 2 shows a relationship between switching state of the magnetic memory cell and magnetic fields provided by the word line and bit line, referred to as an "asteroid curve". Horizontal magnetic field $H_l$ is provided by the bit line, and vertical magnetic field $H_t$ by the word line. According to the asteroid curve, the resistance of magnetic memory cell is switched when the horizontal magnetic field $H_l$ is $H_0$ without vertical magnetic field $H_t$. If vertical magnetic field $H_t$ exists, a lower horizontal magnetic field $H_l$, less than $H_0$, is able to switch the resistance of the selected magnetic memory cell.

In FIG. 2, the resistance of the selected magnetic memory cell is not switchable in area A. The selected magnetic memory cell is switched when outside the area A, to a first state (high resistance as an example) when the applied magnetic field is in the first quadrant, and to a second state (low resistance as an example) when in the second quadrant.

In an MRAM array, a reference magnetic memory cell is arranged for a predetermined number of bit lines (32 or 64). To read the selected magnetic memory cell Cs, a read current through data line D1, magnetic memory cell Cs and bit line B1 is provided. Another reference current through reference data line Dr, reference magnetic memory cell Cr and reference bit line Br is also provided. Data stored in magnetic memory cell Cs is obtained by comparing the voltage level at bit lines B1 and Br.

The asteroid curve of the conventional reference magnetic memory cell Cr is identical to the selected magnetic memory cell Cs, that is, the switch conditions of conventional reference magnetic memory cell Cr and magnetic memory cell Cs are the same. The resistance of reference magnetic memory cell Cr can be switched by providing writing currents to word line W1 and reference bit line Br, or providing strong writing current to reference bit line Br only.

However, as array size increases, it is difficult to ensure that each memory cell and reference memory cell have the same magnetic characteristics due to manufacturing process limitations, such as magnetic resistance ratio, coercivity and interlayer coupling. Most important is uniform distribution of coercivity, which affects the working range of writing currents. Sometimes, higher writing current is required as the coercivity distribution is not uniform. However, the increased writing current can switch resistance of the reference magnetic memory cell, disturbing reading results.

SUMMARY OF THE INVENTION

Magnetic memory arrays are provided. An embodiment of a magnetic memory array comprises a magnetic memory cell comprising a first free ferromagnetic layer, a first pinned ferromagnetic layer, and a first tunnel barrier layer located between the first free ferromagnetic layer and the first pinned ferromagnetic layer, a reference magnetic memory cell comprising a second free ferromagnetic layer, a second pinned ferromagnetic layer, and a second tunnel barrier layer located between the second free ferromagnetic layer and the second pinned ferromagnetic layer, a first bit line providing a first writing magnetic field to the magnetic memory cell, a second bit line providing a second writing magnetic field to the reference magnetic memory cell, and a word line providing a third writing magnetic field to the magnetic memory cell and a fourth writing magnetic field to the reference magnetic memory cell, wherein the third writing magnetic field exceeds the fourth writing magnetic field.

Another embodiment of a magnetic memory array comprises a magnetic memory cell comprising a first free ferromagnetic layer, a first pinned ferromagnetic layer, a first tunnel barrier layer located between the first free ferromagnetic layer and the first pinned ferromagnetic layer, a first major axis and a first short axis, wherein the first major axis and the first short axis have a first aspect ratio, a reference magnetic memory cell comprising a second free ferromagnetic layer, a second pinned ferromagnetic layer, a second tunnel barrier layer located between the second free ferromagnetic layer and the second pinned ferromagnetic layer, a second major axis and a second short axis, wherein the second major axis and the second short axis have a second aspect ratio exceeding the first aspect ratio, a first bit line providing a first writing magnetic field to the magnetic memory cell, a second bit line providing a second writing magnetic field to the reference magnetic memory cell, and a word line providing a third writing magnetic field to the magnetic memory cell and a fourth writing magnetic field to the reference magnetic memory cell, wherein the third writing magnetic field exceeds the fourth writing magnetic field.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 3:
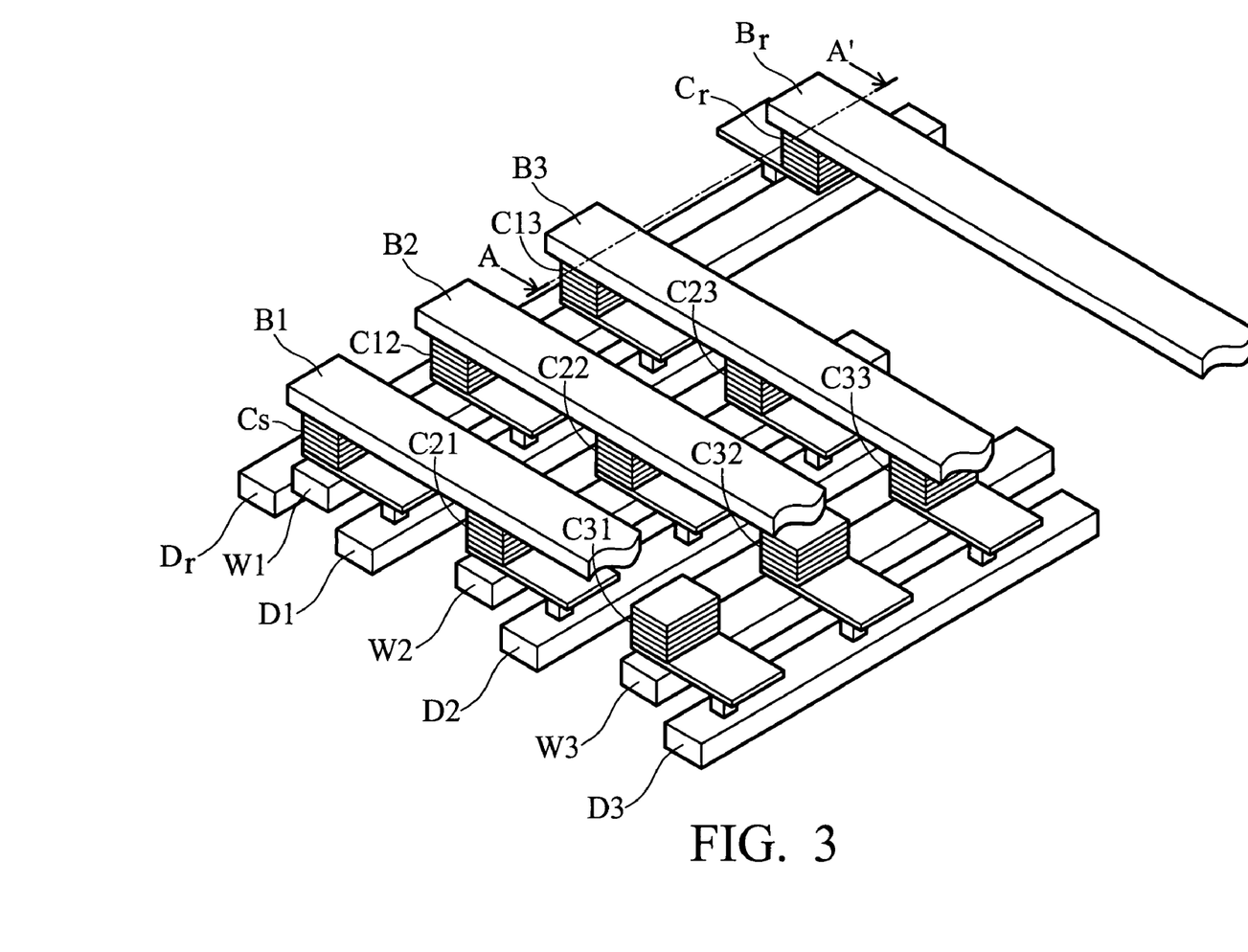
FIG. 3 is a schematic diagram of an MRAM array according to an embodiment of the invention.

FIG. 3 is a schematic diagram of an MRAM array according to an embodiment of the invention. The MRAM array comprises bit lines B1~B3 and word lines W1~W3. The magnetic memory cell located at the intersection of one of bit line and word line comprises a soft magnetic layer (free ferromagnetic layer), a tunnel barrier layer, a hard magnetic layer (pinned ferromagnetic layer) and a non-magnetic conductor. The relative magnetic orientations of the free ferromagnetic layer and the pinned ferromagnetic layer represent stored data of the magnetic memory cell. For example, as the magnetic moments of free ferromagnetic layer and the pinned ferromagnetic layer have the same direction or are "parallel", the magnetic memory cell has relatively low resistance, and the stored data is "0". Contrarily, when the magnetic moments of free ferromagnetic layer and the pinned ferromagnetic layer have opposite direction or are "anti-parallel", the magnetic memory cell has relative high resistance, and the stored data is "1".

The magnetic memory cell is written to by the magnetic fields generated by the selected word line and bit line. Thus, only the magnetic dipole moment of the selected magnetic memory cell is switched. For example, the magnetic fields generated by bit line B1 and word line W1 only switch the magnetic dipole moment of magnetic memory cell Cs, without changing the state of non-selected magnetic memory cells C12, C13, C21, and C31. In FIG. 3, a single memory cell comprises one magnetic memory cell, and the reference magnetic memory cell can comprise a plurality of magnetic memory cells connected in parallel or serial, to obtain a middle state resistance.

Figure 4:
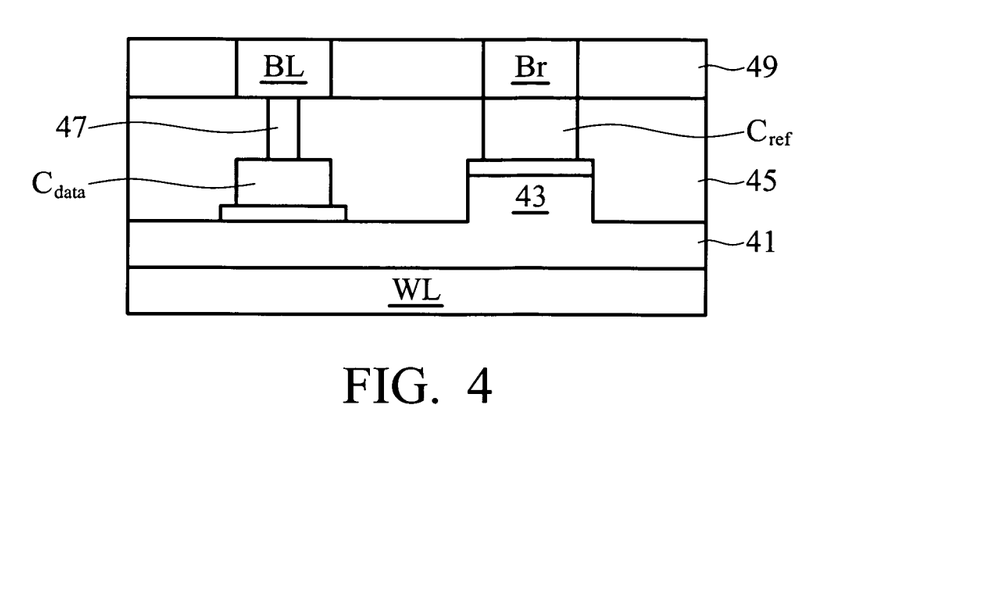
FIG. 4 is a cross section cut along line AA' in FIG. 3 according to an embodiment of the invention.

FIG. 4 is a cross section cut along line AA' in FIG. 3 according to an embodiment of the invention. In this embodiment, the distance between reference magnetic memory cell $C_{ref}$ and word line WL exceeds that between magnetic memory cell $C_{data}$ and word line WL, and the distance between reference magnetic memory cell $C_{ref}$ and reference bit line Br is less than that between magnetic memory cell $C_{data}$ and bit line BL. Here, a combination magnetic field of the magnetic fields respectfully generated by bit line BL and word line WL can be different from that generated by bit line Br and word line WL.

A manufacturing process forms a dielectric layer 41 on word line WL, patterning a salient 43 on dielectric layer 41 by etching using a mask. Next, reference magnetic memory cell $C_{ref}$ and magnetic memory cell $C_{data}$ are formed by etching a plurality of magnetic metal layers using two masks. As shown in FIG. 4, the position of the magnetic memory cell $C_{data}$ is lower than that of reference magnetic memory cell $C_{ref}$. Isolation layer 45 is formed, and a contact via 47 connected to the magnetic memory cell $C_{data}$ is formed by etching, plating conductive materials and chemical mechanical polishing (CMP). Isolation layer 49 is formed on the isolation layer 45, and bit lines BL and Br are patterned. Bit lines BL and Br are formed by etching, plating conductive materials and performing chemical mechanical polishing (CMP).

Figure 5:
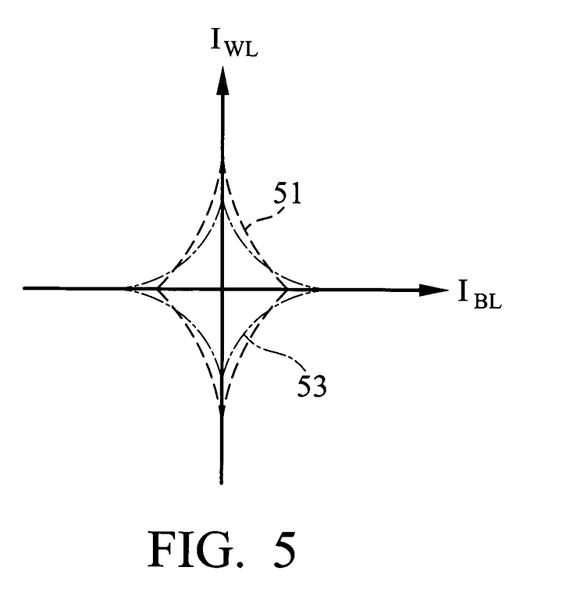
FIG. 5 shows asteroid curves 51 and 53 according to the embodiment shown in FIG. 4.

FIG. 5 shows asteroid curve 51 of reference magnetic memory cell $C_{ref}$ for bit line Br and word line WL, and asteroid curve 53 of magnetic memory cell $C_{data}$ for bit line BL and word line WL according to the embodiment shown in FIG. 4. Reference magnetic memory cell $C_{ref}$ is close to bit line Br. In addition, the distance between word line WL and reference magnetic memory cell $C_{ref}$ exceeds that between word line WL and magnetic memory cell $C_{data}$. Thus, current through bit line Br to define middle state resistance of reference magnetic memory cell $C_{ref}$ is reduced. In addition, magnetic field generated from the current through word line WL influences reference magnetic memory cell $C_{ref}$ less than magnetic memory cell $C_{data}$ when writing data to magnetic memory cell $C_{data}$. Thus, middle state resistance of reference magnetic memory cell $C_{ref}$ is stabilized, decreasing data reading disturbance.

Figure 6:
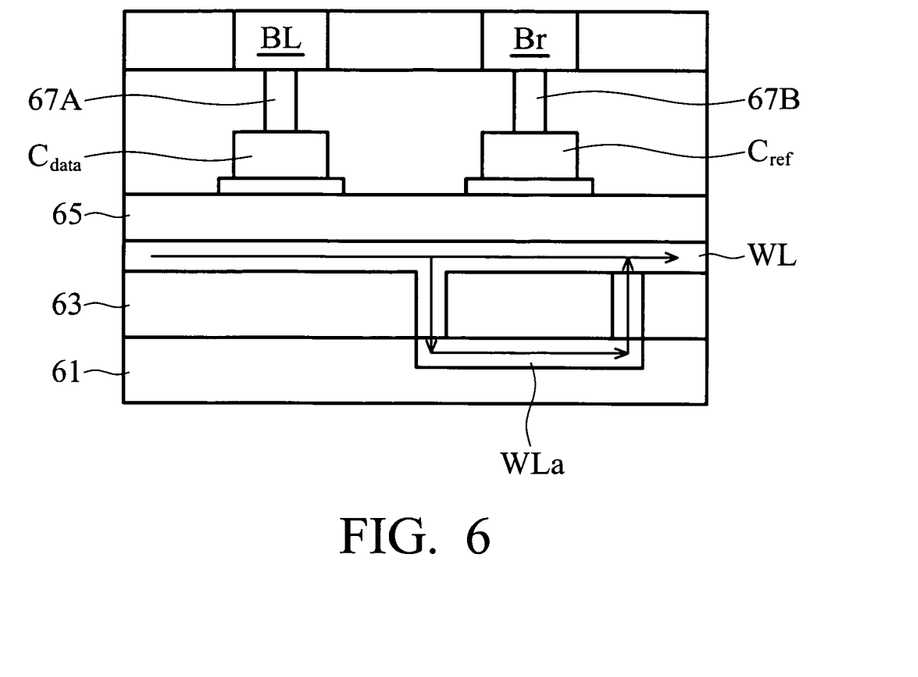
FIG. 6 is a cross section of an MRAM array according to another embodiment of the invention.

FIG. 6 is a cross section of an MRAM array according to another embodiment of the invention. In this embodiment, the current path of word line WL under reference magnetic memory cell $C_{ref}$ is changed. FIG. 6 shows another current path branch WLa. As the magnetic field generated by the current is in direct proportion to the current value, and inverse proportion to the distance therebetween, the total magnetic field generated by currents through word line WL and current path brunch WLa is less than that generated by a single word line WL at reference magnetic memory cell $C_{ref}$. Here, a combination magnetic field of the magnetic fields respectively generated by bit line BL and word line WL can be different from that generated by bit line Br and word line WL.

A manufacturing process forms current path branch WLa in dielectric layer 61 under the reference magnetic memory cell $C_{ref}$ by etching dielectric layer 61, plating metal materials and chemical mechanical polishing. Contact vias connected to word line WL and current path branch WLa are formed by etching isolation layer 63, plating metal materials and chemical mechanical polishing. Isolation layer 65 is formed after forming word line WL, and reference magnetic memory cell $C_{ref}$, magnetic memory cell $C_{data}$ and bit lines are formed using conventional process.

Figure 7:
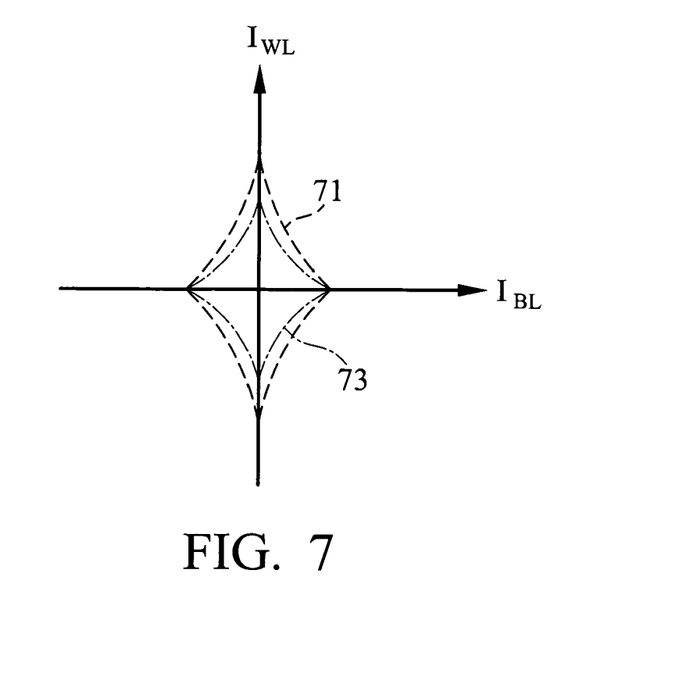
FIG. 7 shows asteroid curves 71 and 73 according to the embodiment shown in FIG. 6.

FIG. 7 shows asteroid curve 71 of reference magnetic memory cell $C_{ref}$ for bit line Br and word line WL, and asteroid curve 73 of magnetic memory cell $C_{data}$ for bit line BL and word line WL according to the embodiment shown in FIG. 6. The total magnetic field generated by currents through word line WL and current path branch WLa at reference magnetic memory cell $C_{ref}$ is less than that generated by a single word line WL at magnetic memory cell $C_{data}$. Thus, when writing data to magnetic memory cell $C_{data}$, reference magnetic memory cell $C_{ref}$ influenced by the magnetic field generated from the current through word line WL is mitigated. Therefore, middle state resistance of reference magnetic memory cell $C_{ref}$ is stabilized, decreasing data reading disturbance.

Figure 8:
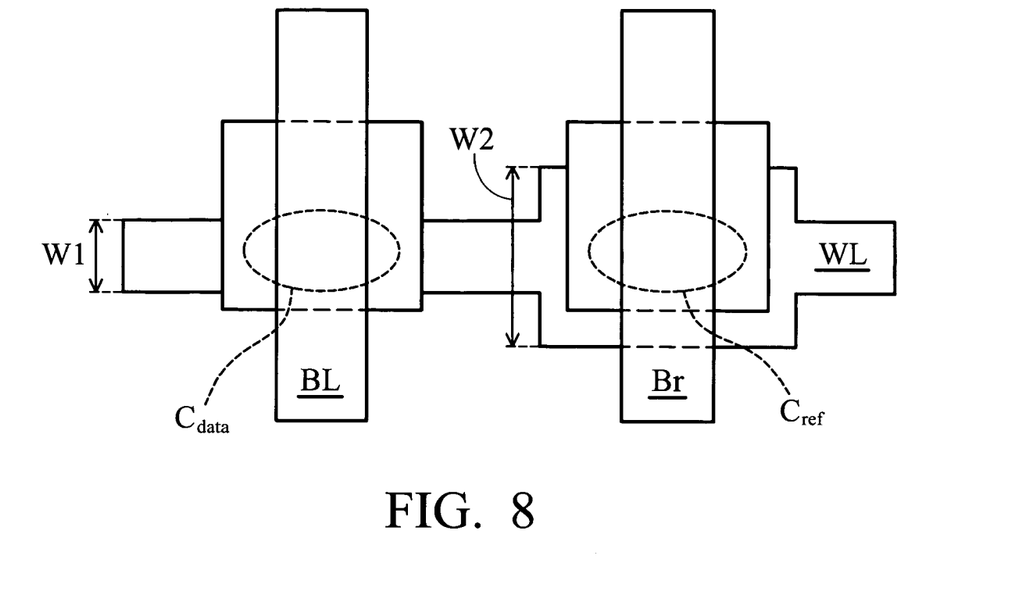
FIG. 8 is a top view of an MRAM array according to another embodiment of the invention.

FIG. 8 is a top view of an MRAM array according to another embodiment of the invention. In FIG. 8, line width of word line WL near magnetic memory cell $C_{data}$ is W1, near reference magnetic memory cell $C_{ref}$ is W2, wherein line width W2 exceeds W1. The expanded word line results in the generated magnetic field decreasing as the current density is decreased. Thus, the generated magnetic field on reference magnetic memory cell $C_{ref}$ is decreased with the same current. Here, a combination magnetic field of the magnetic fields respectively generated by bit line BL and word line WL can be different from that generated by bit line Br and word line WL.

FIG. 7 shows asteroid curve 71 of reference magnetic memory cell $C_{ref}$ for bit line Br and word line WL, and asteroid curve 73 of magnetic memory cell $C_{data}$ for bit line BL and word line WL according to the embodiment shown in FIG. 8. In this embodiment, the magnetic field generated from the current through word line WL influences reference magnetic memory cell $C_{ref}$ less than magnetic memory cell $C_{data}$ when writing data to magnetic memory cell. Thus, middle state resistance of reference magnetic memory cell $C_{ref}$ is stabilized, decreasing data reading disturbance.

Figure 9:
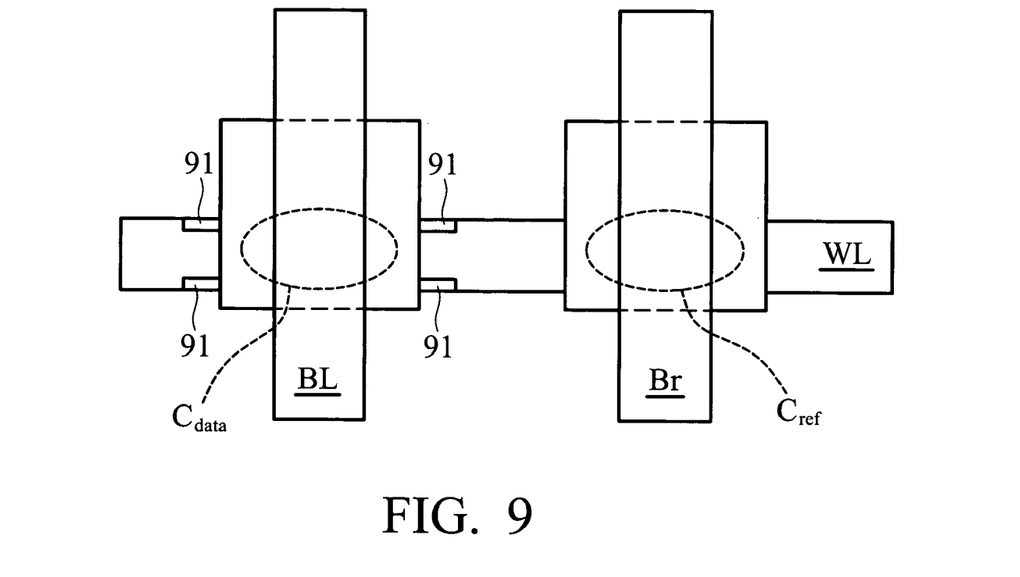
FIG. 9 is a top view of an MRAM array according to another embodiment of the invention.

FIG. 9 is a top view of an MRAM may according to another embodiment of the invention. In FIG. 9, a cladding layer 91 is formed around word line WL near magnetic memory cell $C_{data}$ with an opening between the magnetic memory cell $C_{data}$ and word line WL. According to the technology disclosed in U.S. Pat. No. 6,351,409, a stronger magnetic field is obtained at an opening of a cladding layer by cladding the cladding layer around a metal line. Thus, in this embodiment, the generated magnetic field on reference magnetic memory cell $C_{ref}$ is less than magnetic memory cell $C_{data}$ with the same current. Here, a combination magnetic field of the magnetic fields respectively generated by bit line BL and word line WL can be different from that generated by bit line Br and word line WL.

FIG. 7 shows asteroid curve 71 of reference magnetic memory cell $C_{ref}$ for bit line Br and word line WL, and asteroid curve 73 of magnetic memory cell $C_{data}$ for bit line BL and word line WL according to the embodiment shown in FIG. 9. In this embodiment, the magnetic field generated from the current through word line WL influences reference magnetic memory cell $C_{ref}$ less than magnetic memory cell $C_{data}$ when writing data to magnetic memory cell. Thus, middle state resistance of reference magnetic memory cell $C_{ref}$ is stabilized, decreasing data reading disturbance.

Figure 10:
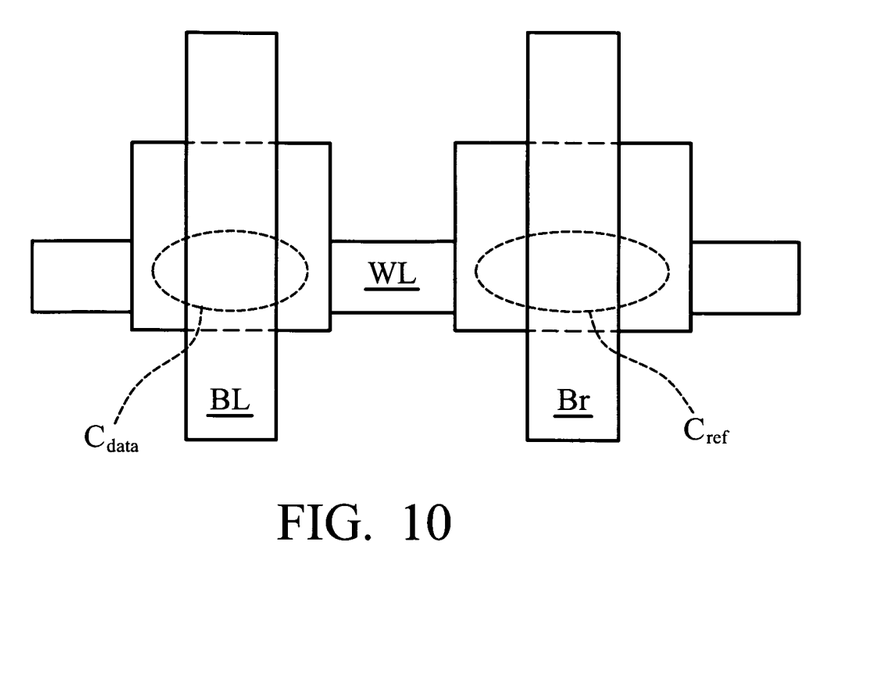
FIG. 10 is a top view of an MRAM array according to another embodiment of the invention.

FIG. 10 is a top view of an MRAM array according to another embodiment of the invention. In this embodiment, the aspect ratio of reference magnetic memory cell $C_{ref}$ exceeds that of magnetic memory cell $C_{data}$. As a magnetic memory cell with larger aspect ratio has a larger coercivity, a larger writing current is required to switch the resistance of reference magnetic memory cell $C_{ref}$ with larger aspect ratio. Thus, in this embodiment, it is harder to switch the resistance of reference magnetic memory cell $C_{ref}$ with the same magnetic field. Here, a combination magnetic field of the magnetic fields respectively generated by bit line BL and word line WL can be equal to that generated by bit line Br and word line WL.

A manufacturing process increases the major axis and decreases the short axis of magnetic memory cell $C_{ref}$ when defining the magnetic memory cell $C_{ref}$. Thus, the target of the reference magnetic memory cell $C_{ref}$ having a larger aspect ratio than magnetic memory cell $C_{data}$ is achieved. In addition, in another embodiment, the size of magnetic memory cell $C_{ref}$ and magnetic memory cell $C_{data}$ can be defined as a identical value. Thus, the resistances of the magnetic memory cells at high and low states are not changed, and the peripheral circuit can retain its original design when the aspect ratio of the reference magnetic memory cell $C_{ref}$ is changed.

Figure 11:
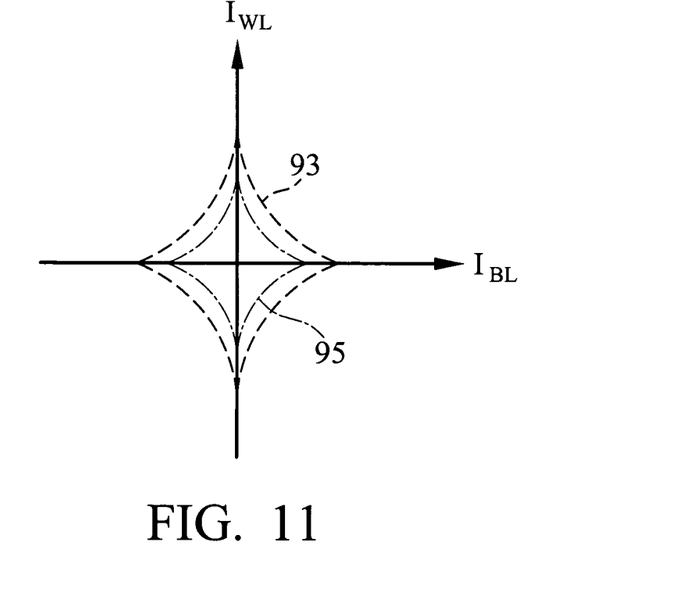
FIG. 11 shows asteroid curves 93 and 95 according to the embodiment shown in FIG. 10.

FIG. 11 shows asteroid curve 93 of reference magnetic memory cell $C_{ref}$ for bit line Br and word line WL, and asteroid curve 95 of magnetic memory cell $C_{data}$ for bit line BL and word line WL according to the embodiment shown in FIG. 10. In this embodiment, as the coercivity of reference magnetic memory cell $C_{ref}$ is increased, the magnetic field generated from the current through word line WL influences reference magnetic memory cell $C_{ref}$ less than magnetic memory cell $C_{data}$ when writing data to magnetic memory cell. Thus, middle state resistance of reference magnetic memory cell Cref is stabilized, decreasing data reading disturbance.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A magnetic memory array, comprising:
    a magnetic memory cell comprising a first free ferromagnetic layer, a first pinned ferromagnetic layer, and a first tunnel barrier layer located between the first free ferromagnetic layer and the first pinned ferromagnetic layer;
    a reference magnetic memory cell comprising a second free ferromagnetic layer, a second pinned ferromagnetic layer, and a second tunnel barrier layer located between the second free ferromagnetic layer and the second pinned ferromagnetic layer;
    a first bit line providing a first writing magnetic field to the magnetic memory cell;
    a second bit line providing a second writing magnetic field to the reference magnetic memory cell; and
    a word line providing a third writing magnetic field to the magnetic memory cell and a fourth writing magnetic field to the reference magnetic memory cell, wherein the third writing magnetic field exceeds the fourth writing magnetic field.

2. The magnetic memory array as claimed in claim 1, wherein a first combination magnetic field of the first writing magnetic field and the third writing magnetic field is different from a second combination magnetic field of the third writing magnetic field and the fourth writing magnetic field.

3. The magnetic memory array as claimed in claim 1, wherein the magnetic memory cell is closer to a first region than a second region of the word line, the reference magnetic memory cell is closer to the second region of the word line, and the line width of the word line in the second region exceeds that in the first region.

4. The magnetic memory array as claimed in claim 1, wherein the magnetic memory cell is closer to a first region than a second region of the word line, the reference magnetic memory cell is closer to the second region of the word line, and the word line further comprises a cladding layer in the first region.

5. The magnetic memory array as claimed in claim 4, wherein the cladding layer is cladding the word line, and an opening is located between the word line and the magnetic memory cell.

6. The magnetic memory array as claimed in claim 4, wherein the material of the cladding layer is a ferromagnetic material.

7. The magnetic memory array as claimed in claim 1, wherein a first distance is between the word line and the magnetic memory cell, and a second distance exceeding the first distance is between the word line and the reference magnetic memory cell.

8. The magnetic memory array as claimed in claim 7, wherein a third distance is between the first bit line and the magnetic memory cell, and a fourth distance shorter than the third distance is between the second bit line and the reference magnetic memory cell.

9. The magnetic memory array as claimed in claim 1, wherein the magnetic memory cell is closer to a first region than a second region of the word line, the reference magnetic memory cell is closer to the second region of the word line, and the word line comprises a first current path and a second current path in the second region.

10. The magnetic memory array as claimed in claim 9, wherein a first distance is between the first current path and the reference magnetic memory cell, and a second distance exceeding the first distance is between the second current path and the reference magnetic memory cell.

* * * * *